(12) United States Patent
Chan et al.

(10) Patent No.: US 10,795,242 B2
(45) Date of Patent: Oct. 6, 2020

(54) ELECTRONICS DEVICE THAT DISSIPATES INTERNAL DEVICE HEAT VIA HEAT SINK HAVING EXPOSED SURFACE

(71) Applicant: Avigilon Corporation, Vancouver (CA)

(72) Inventors: Winson Chan, Vancouver (CA); Thomas W. Holbrook, Vancouver (CA); Colin Paul Janssen, Vancouver (CA)

(73) Assignee: AVIGILON CORPORATION, Vancouver (CA)

( * ) Notice: Subject to any disclaimer, the term of this patent is extended or adjusted under 35 U.S.C. 154(b) by 217 days.

(21) Appl. No.: 15/996,137

(22) Filed: Jun. 1, 2018

(65) Prior Publication Data
US 2018/0348600 A1    Dec. 6, 2018

Related U.S. Application Data

(60) Provisional application No. 62/515,330, filed on Jun. 5, 2017.

(51) Int. Cl.
*G03B 17/02* (2006.01)
*G03B 17/55* (2006.01)
(Continued)

(52) U.S. Cl.
CPC ............ *G03B 17/55* (2013.01); *G03B 17/02* (2013.01); *H04N 5/2252* (2013.01); *H04N 5/23238* (2013.01); *H05K 7/2039* (2013.01); *H05K 7/20445* (2013.01); *H05K 1/0203* (2013.01); *H05K 1/144* (2013.01); *H05K 2201/10151* (2013.01)

(58) Field of Classification Search
CPC ................................. G03B 17/55; G03B 17/02
USPC .................................. 396/427, 419; 348/143
See application file for complete search history.

(56) References Cited

U.S. PATENT DOCUMENTS

| 4,840,222 A | 6/1989 | Lakin et al. | |
| 5,045,642 A * | 9/1991 | Ohta | ................... H01L 23/3672 174/255 |

(Continued)

FOREIGN PATENT DOCUMENTS

| CN | 203731171 U | 7/2014 | |
| CN | 102966871 B | 1/2016 | |
| WO | WO-2016176075 A1 * | 11/2016 | ......... H04N 5/23245 |

*Primary Examiner* — Clayton E. LaBalle
*Assistant Examiner* — Fang-Chi Chang
(74) *Attorney, Agent, or Firm* — Daniel Hammond

(57) ABSTRACT

A power consuming electronics device that dissipates internal device heat via a heat sink is disclosed. The power consuming electronics device includes first and second complementary housing parts. The first housing part includes a first surface ending at a first peripheral edge, and the second housing part including a second surface ending at a second peripheral edge. The power consuming electronics device also includes a heat sink having an air exposed surface that is interposed between the first and second peripheral edges. Surface edges of the air exposed surface abut the first and second peripheral edges of the housing parts and are respectively matched therewith in shape and dimension so that an overall composite surface formed by the first and second surfaces of the housing parts and the air exposed surface of the heat sink is substantially continuous and uniform.

18 Claims, 6 Drawing Sheets

(51) Int. Cl.
   *H05K 7/20*   (2006.01)
   *H04N 5/225*  (2006.01)
   *H04N 5/232*  (2006.01)
   *H05K 1/02*   (2006.01)
   *H05K 1/14*   (2006.01)

(56) References Cited

U.S. PATENT DOCUMENTS

| | | |
|---|---|---|
| 7,614,804 B2 | 11/2009 | Kim |
| 9,167,137 B2 | 10/2015 | Neufeld et al. |
| 9,451,133 B2 | 9/2016 | Stark et al. |
| 9,674,450 B2 | 6/2017 | Mohan |
| 2008/0310108 A1 | 12/2008 | Eriksson et al. |
| 2009/0292083 A1 | 11/2009 | Zhang et al. |
| 2011/0242816 A1* | 10/2011 | Chowdhury ............ F21V 29/63 362/294 |
| 2012/0314420 A1 | 12/2012 | Yamamoto et al. |
| 2013/0051039 A1* | 2/2013 | Min ..................... F21V 23/006 362/396 |
| 2014/0104479 A1 | 4/2014 | Samuels et al. |
| 2014/0104845 A1 | 4/2014 | Boomgaarden et al. |
| 2016/0024366 A1 | 1/2016 | Iwamura et al. |
| 2016/0119514 A1 | 4/2016 | Sugimura et al. |
| 2016/0127618 A1* | 5/2016 | Bart ..................... H04N 5/2252 348/373 |
| 2017/0131621 A1 | 5/2017 | Tang et al. |

* cited by examiner

ELECTRONICS DEVICE THAT DISSIPATES INTERNAL DEVICE HEAT VIA HEAT SINK HAVING EXPOSED SURFACE

RELATED APPLICATION DATA

The present application claims the benefit of priority of provisional application No. 62/515,330 filed on Jun. 5, 2017, the content of which is hereby incorporated by reference in its entirety.

FIELD

The present subject-matter relates to dissipating heat via heat sinks and, in particular, to an electronics device that dissipates internal device heat via a heat sink having air exposed surface.

BACKGROUND

Thermal management relates to how excess heat generated by electronic devices and circuitry is reduced and controlled in order to improve reliability and prevent premature failure. In connection with thermal management, one methodology for cooling of electronic devices and circuitry is to provide one or more heat sinks. A heat sink is a metal mass with special design to conduct and radiate heat from an electrical component.

SUMMARY

According to one example embodiment, there is provided a power consuming electronics device that includes first and second complementary housing parts. The first housing part includes a first surface ending at a first peripheral edge, and the second housing part includes a second surface ending at a second peripheral edge. The power consuming electronics device also includes a heat sink having an air exposed surface that is ring-shaped and interposed between the first and second peripheral edges. Surface edges of the air exposed surface that abut the first and second peripheral edges of the housing parts are respectively matched therewith in shape and dimension so that an overall composite surface formed by the first and second surfaces of the housing parts and the air exposed surface of the heat sink is substantially continuous and uniform. The power consuming electronics device also includes least one heat-generating device component located within the electronics device and connected to the heat sink. Heat is drawn away from the device component via the heat sink when the electronics device is on and the device component is generating heat.

According to another example embodiment, there is provided a dome camera that includes a first semi-spherical housing part including a first surface ending at a first peripheral edge. The domes camera also includes a second semi-spherical housing part including a second surface ending at a second peripheral edge. The second semi-spherical housing part is complementary to the first semi-spherical housing part. The dome camera also includes a heat sink having an air exposed surface that is ring-shaped and interposed between the first and second peripheral edges. Surface edges of the air exposed surface that abut the first and second peripheral edges of the housing parts are respectively matched therewith in shape and dimension so that an overall composite surface formed by the first and second surfaces of the housing parts and the air exposed surface of the heat sink is substantially continuous and uniform. The dome camera also includes at least one heat-generating device component located within the dome camera and connected to the heat sink. Heat is drawn away from the device component via the heat sink when the dome camera is on and the device component is generating heat.

According to yet another example embodiment, there is provided a device that includes first and second complementary housing parts. The first housing part includes a first surface ending at a first peripheral edge. The second housing part includes a second surface ending at a second peripheral edge. A heat sink having an air exposed surface is interposed between the first and second peripheral edges. Surface edges of the air exposed surface are respectively matched with the first and second peripheral edges of the housing parts for flush abutment to provide combination-discreetness of the an overall composite surface formed by the first and second surfaces of the housing parts and the air exposed surface of the heat sink. At least one heat-generating device component located within the device is connected to the heat sink. When the device component is generating heat, the heat is drawn away from the device component via the heat sink.

BRIEF DESCRIPTION OF THE DRAWINGS

Reference will now be made, by way of example, to the accompanying drawings.

Similar or the same reference numerals may have been used in different figures to denote similar example features illustrated in the drawings.

DETAILED DESCRIPTION OF EXAMPLE EMBODIMENTS

It will be understood that when an element is herein referred to as being "connected", "in communication with" or "coupled" to another element, it can be directly connected, directly in communication with or directly coupled to the other element or intervening elements may be present. In contrast, when an element is herein referred to as being "directly connected", "directly in communication with" or "directly coupled" to another element, there are no intervening elements present. Other words used to describe the relationship between elements should be interpreted in a like fashion (i.e., "between" versus "directly between", "adjacent" versus "directly adjacent", etc.).

As used herein, the term "ring-shaped" refers to a circle shape in respect of two-dimensions and, in respect of three-dimensions, a section of a sphere at least partly defined by opposing boundaries constituted by two circles traced out on the surface of the sphere.

Certain example embodiments relate to cameras (for example, dome cameras and other types of security cameras); however some example embodiments are directed to electronic devices other than cameras. For example, example embodiments may be applied to smart phones, handheld computing devices, smart kitchen devices, drones, etc.

Figure 1:
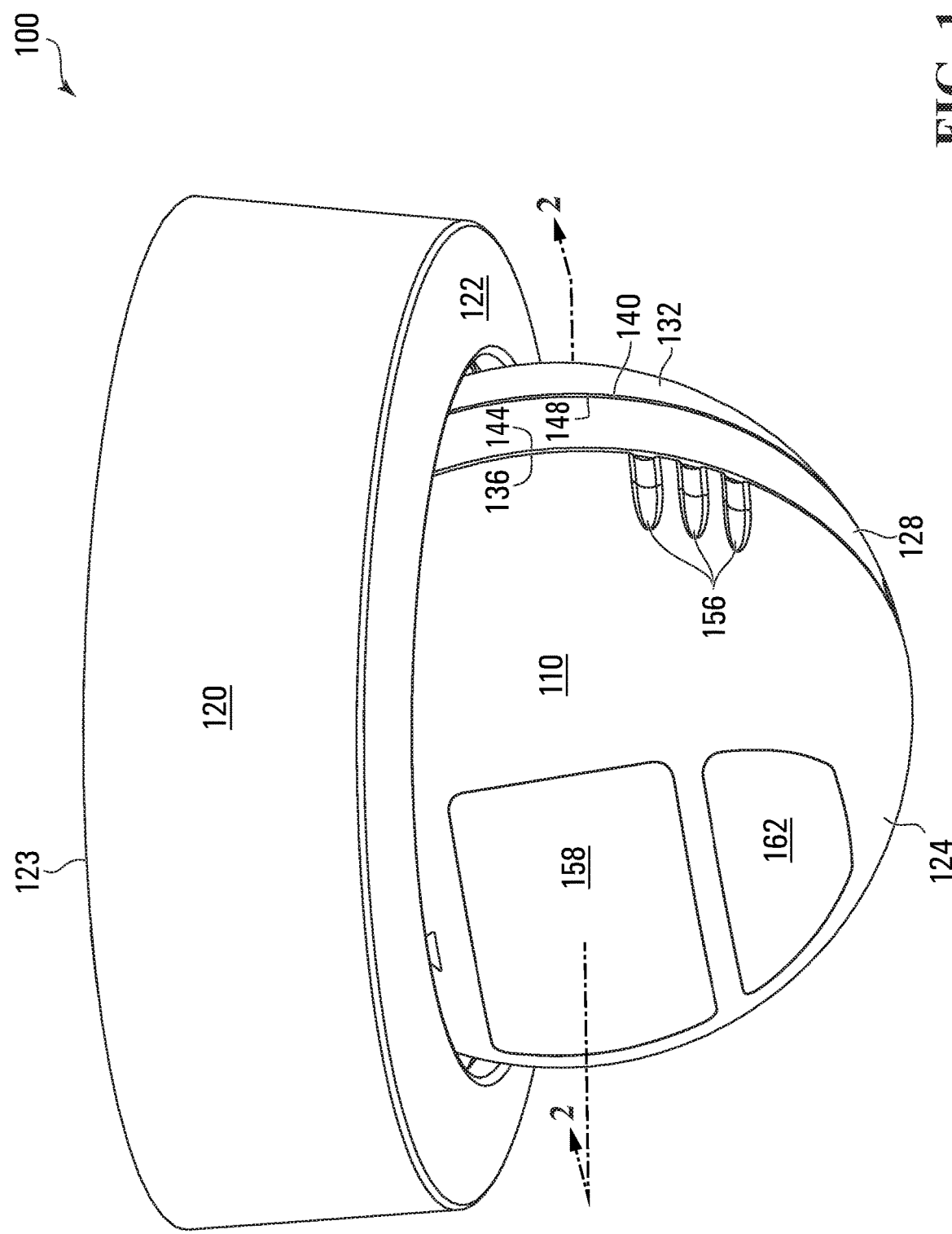
FIG. 1 illustrates a perspective view of a dome camera device in accordance with at least one example embodiment, the dome camera including a movable spherical assembly and a stationary bezel portion.

Reference is now made to FIG. 1, which illustrates a perspective view of a dome camera device 100 in accordance with at least one example embodiment. The dome camera device 100 includes a movable spherical assembly 110 and a stationary bezel portion 120. With respect to movement of the spherical assembly 110, the spherical assembly 110 tilts approximately from zero to 90 degrees and pan rotates more than 360 degrees in order to ensure that the dome camera device 100 may be set to a desired field of view. Also, a portion of the spherical assembly 110 is sized to fit within the bezel portion 120. Flat surface 122 of the bezel portion 120 covers the interior of the bezel portion 120.

Upper circular edge 123 of the bezel portion 120 is configured to be installed flush against a suitable flat surface such as, for example, a ceiling tile. Furthermore, the dome camera device 100 may be installed on a ceiling with a plane parallel to the surface 122 also being parallel to the ceiling. The dome camera device 100 may also be installed on a pendant with the plane parallel to the surface 122 again also parallel to the ceiling from which the pendant may extend down from. The dome camera device 100 may also be installed on a wall with the plane parallel to the surface 122 also being parallel to the wall.

The spherical assembly 110 includes a first housing part 124, a heat sink 128 and a second housing part 132. In accordance with at least some examples, the first housing part 124, the second housing part 132 and the bezel portion 120 may all be made of a combination of polycarbonate (PC) and acrylonitrile-butadiene-styrene (ABS).

Regarding the heat sink 128 this may, in accordance with some examples, be made wholly or in part from aluminum. The heat sink 128 has an air exposed surface that is interposed between the first housing part 124 and the second housing part 132. Since edges 144 and 148 of the air exposed surface are plane curves which make complete traces around a spherical surface, the air exposed surface of the heat sink 128 is ring-shaped. In alternative example embodiments, the exposed surface has some other type of shape. For example, in the case of an electronics device having a housing with an overall rectangular prism shape, the exposed surface could take the dimensions of four rectangles arranged to match the overall shape of the housing. Other suitable shapes are also contemplated. For example, in the case of an electronics device having a housing with an overall triangular prism shape, the exposed surface could take the dimensions of three rectangles arranged to match the overall shape of the housing. As yet another example, in the case of an electronics device having a housing with an overall pentagonal prism shape, the exposed surface could take the dimensions of five rectangles arranged to match the overall shape of the housing. Thus, numerous different shape possibilities are contemplated.

An impact of the heat sink 128 having the air exposed surface instead of no such surface (i.e. the heat sink being entirely contained internally within the spherical assembly 110) is that heat transmitted through the heat sink is able to be radiated out to the ambient air. In accordance with some examples, the air exposed surface of the heat sink 128 is a finished surface with the finish being electrocoating (e-coating) or a powder coating which may increase the efficiency of radiative heat transfer to the surrounding environment. Thus, the heat sink 128 allows a greater amount of permitted heat to be generated within the spherical assembly 110 of the dome camera device 100 then would be possible otherwise. In this manner, heat generating components normally found outside of the spherical assembly 110 (for example, within a separate camera tail assembly such as the one shown and described in commonly owned U.S. Pat. No. 9,167,137 entitled "Security Camera Having a Cable Assembly with an Integrated Processing Module") can be brought within the spherical assembly 110. For instance, regarding the example where the camera device is attached to the camera tail assembly, the internalization of heat generating components within the spherical assembly 110 may result in a reduced size or even elimination of the camera tail assembly. In accordance with at least some examples, the heat sink 128 facilitates, in respect of when the camera is operated, maintenance of an ambient temperature for the internal components of the spherical assembly 110 within any suitable range not outside of international or other recognized safety standards; and has a touch temperature for its externally exposed surface within any suitable range not outside of international or other recognized safety standards.

In terms of geometry of the heat sink 128, surface edge 144 of the air exposed surface of the heat sink 128 abuts a peripheral edge 136 of the first housing part 124. Similarly, surface edge 148 of the air exposed surface of the heat sink 128 abuts a peripheral edge 140 of the second housing part 132. Also, it should be noted that the term "peripheral edge" as used herein is sometimes referred to by those skilled in the art of molding (for manufacturing) as a "parting line" or a "split line".

As shown in FIG. 1, the surface edges 144 and 148 are matched in shape and dimension with the peripheral edges 136 and 140 respectively so that an overall composite surface formed by the air exposed surface of the heat sink 128 and the surfaces of the first and second complementary housing parts 124 and 132 is substantially continuous and uniform. Also, it can be said that there is flush abutment between the above-mentioned edges to provide combination-discreetness of the overall composite surface.

It will be noted that since the surface edge 136 traces a bigger circle around the overall sphere shape of the assembly than the surface edge 140, so too is the circle traced out by the surface edge 144 bigger than the circle traced out by the surface edge 148. Thus the illustrated heat sink 128 tapers towards the rear in the region of the exposed surface. Also, in the illustrated example embodiment the peripheral edge 136 is at a midpoint of the spherical assembly 110, the impact of which may be to limit the number of parts required for spherical shape construction while using traditional molding processes. In alternative example embodiments, different tapering(s) and/or expansion(s) for this heat sink region are contemplated.

Figure 2:
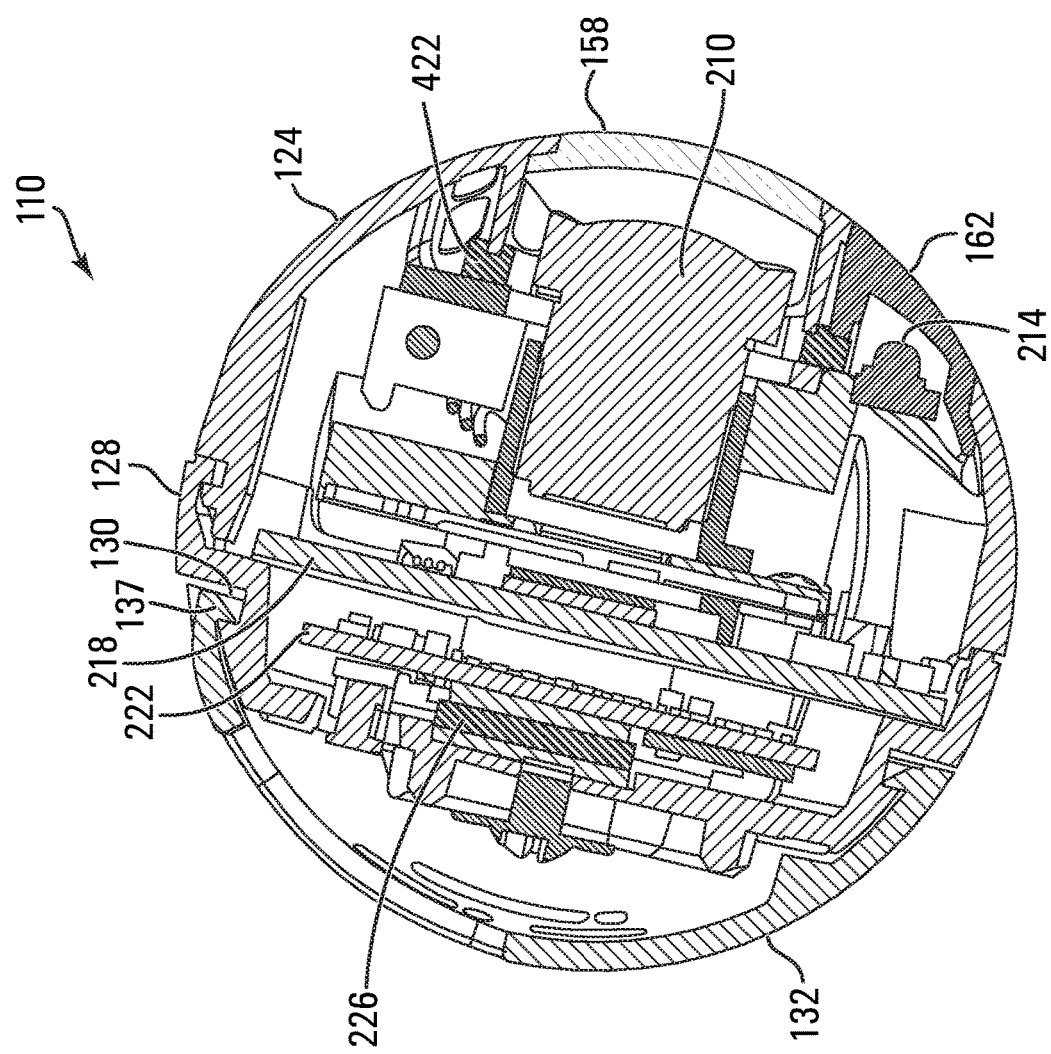
FIG. 2 illustrates a cross-sectional view, taken along line 2-2, of the spherical assembly of the dome camera shown in FIG. 1.

FIG. 2 illustrates a cross-sectional view of the spherical assembly 110 of the dome camera device 100 shown in FIG. 1. As shown, multiple components are housed within the spherical assembly 110 including a lens and imaging unit 210, IR emitter 214, a sensor printed circuit board assembly (PCBA) 218, a digital PCBA 222 and thermal interface material 226 positioned between the digital PCBA 222 and the heat sink 128 (in the illustrated example embodiment the thermal interface material 226 is more specifically a suitably sized gap pad). Regarding the lens and imaging unit 210, this captures images and video of a scene in the field of view of the dome camera device 100. Captured images and video are processed within the PCBAs coupled to the lens and imaging unit 210. This processing may include formatting the outputted image data to various image standards such as, for example, H.264 or H.265. Additionally, this processing may further include:

Analyzing the captured images and video using video analytics to detect objects and to classify the objects; and Compressing, encoding, and decoding the captured images and video.

With reference to both FIGS. 1 and 2, the spherical assembly 110 includes optically clear window 158 and IR transparent window or lenslet 162. The IR emitter 214 is positioned behind the IR transparent window 162. Regarding the transparent window 158, this allows light external to the dome camera device 100 to pass into the spherical assembly 110 which is then captured by the imaging unit 210 to form the images and video. The image sensor may be any sensor part understood by one skilled in the art to be suitable including, for example, CMOS, NMOS or CCD.

Regarding the IR lenslet 162, this may be made of a black material that allows IR light to pass through, thereby helping the IR emitter 214 blend into the appearance of spherical assembly 110. The use of a smooth spherical surface incorporating the IR lenslet 162 and the transparent window 158 makes it more difficult to tell in which direction the imaging unit 210 is facing and allows for a smaller architecture of dome camera device 100. Also, it should be noted that, in some examples, the dome camera device 100 may include neither the IR emitter 214 nor the IR lenslet 162. In other words, the IR section of the dome camera device 100 is an optional section. An impact of the absence of the IR section of the dome camera device 100 may be a reduced need for heat dissipation.

With reference to FIG. 2, the illustrated heat sink 128 defines a groove 130 that extends full circle around the heat sink 128. The groove 130 is sized and shaped to align with a complementary-shaped snap 137 of the second housing part 132. This arrangement keeps the second housing part 132 secured to the heat sink 128 while allowing azimuthal rotation of heat sink 128 and the first housing part 124 relative to the second housing part 132.

Figure 3:
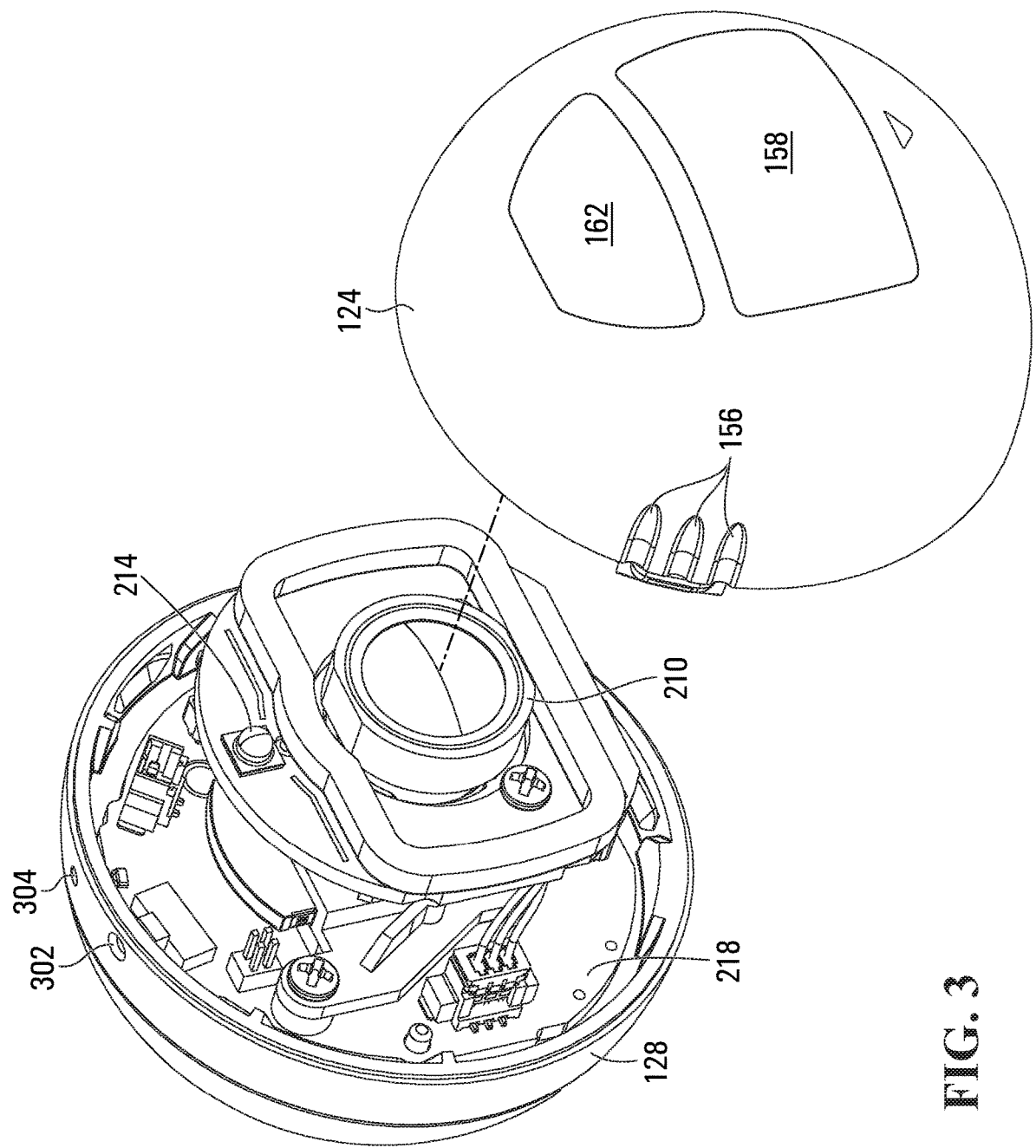
FIG. 3 illustrates a perspective view of the spherical assembly shown in FIG. 2, a housing part of the spherical assembly being shown as partly disassembled to reveal internal components of the spherical assembly.

FIG. 3 illustrates a perspective view of the spherical assembly 110 with the first housing part 124 being shown in a partly disassembled state to reveal the internal components of the spherical assembly 110. Outer grooves 156 on the first housing part 124, which are provided to alleviate molding issues, are positioned parallel to the direction of rotation of spherical assembly 110. Also shown in FIG. 3 is an aperture 302 defined in the ring-shaped wall of the heat sink 128. The aperture 302 exposes a factory reset switch provided to enable a resetting of the dome camera device 100. Adjacent the aperture 302 is a status indicator light 304 to facilitate provide visible light representations of status information.

Figure 4:
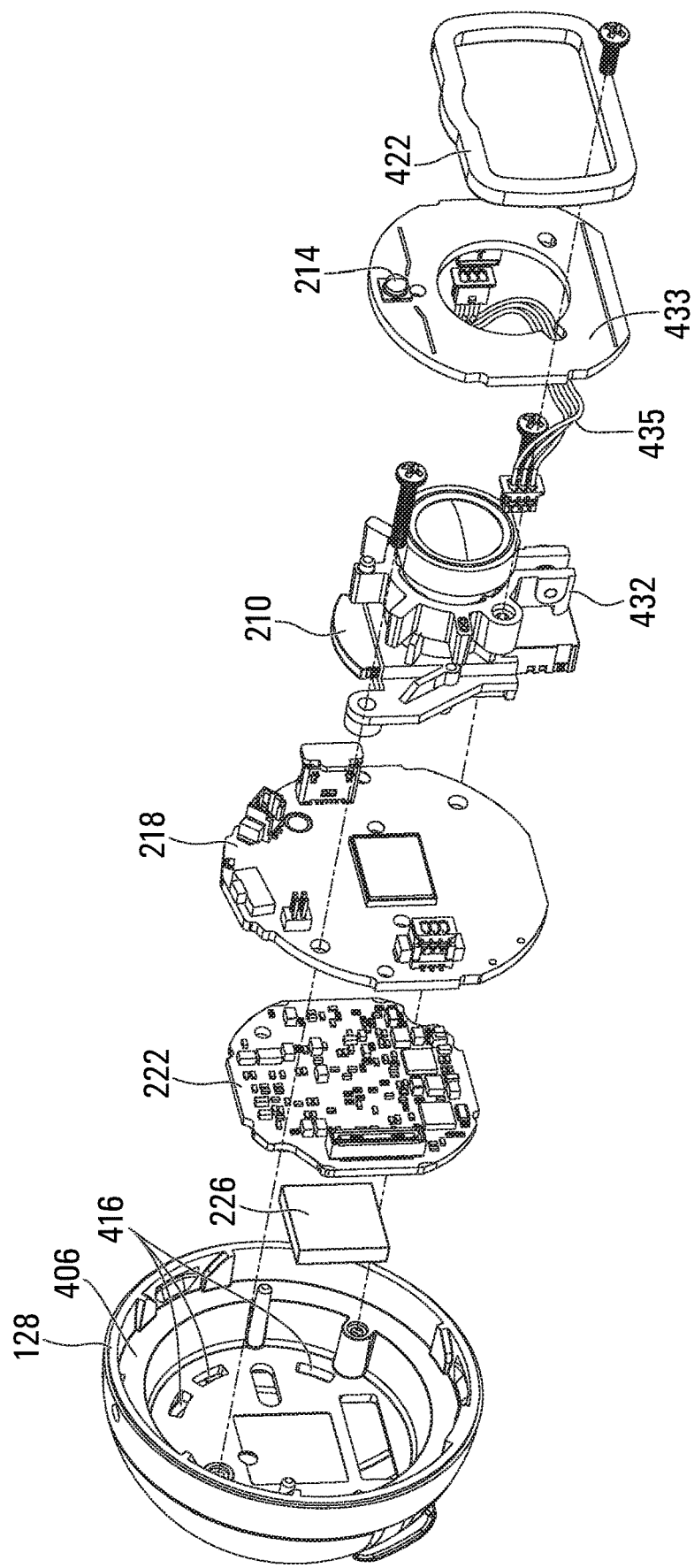
FIG. 4 is an exploded view of the internal components shown in FIG. 3.

FIG. 4 is an exploded view of the internal components (shown in FIG. 3) of the spherical assembly 110. As previously herein described, included within the illustrated spherical assembly 110 are two PCBAs: the sensor PCBA 218 and the digital PCBA 222. The sensor PCBA 218 includes exposed copper in the form of contacts on the underside of the board. This exposed copper is brought into contact with inner ring 406 of the heat sink 128 during assembly of the spherical assembly 110. This direct contact between the inner ring 406 and the exposed copper facilitates the transmission of heat from the sensor PCBA 218 to the heat sink 128. In contrast to the sensor PCBA 218, the digital PCBA 222 is thermally connected to the heat sink 128 via the thermal interface material 226. In at least one example, the thermal interface material 226 is attached directly to the semiconductor chip of the digital PCBA 222 that generates the most heat which may be a System-on-Chip (SoC), for example.

Figure 5:
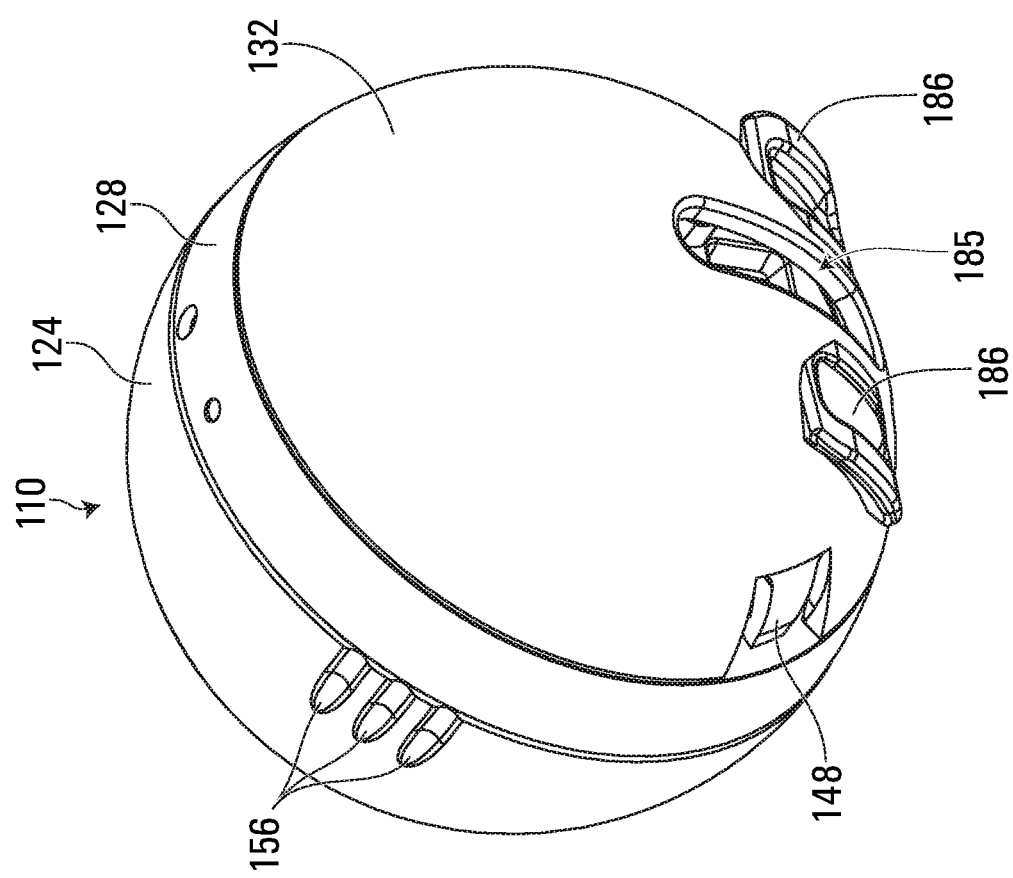
FIG. 5 is a rear perspective view of the spherical assembly shown in FIG. 2.

A plurality of slotted holes 416 are defined within a rear wall of the heat sink 128. The holes 416 may facilitate lowering temperatures within the regions of the heat-generating internal components by allowing hot air a path to escape into the rear region of the spherical assembly 110. The holes 416 will be covered by the second housing part 132 when the spherical assembly 110 is fully assembled; however, referring to FIG. 5 which shows a rear perspective view of the spherical assembly 110, defined in the second housing part 132 is an aperture 185 which allows hot air to escape outside the spherical assembly 110. In the illustrated example embodiment the aperture 185 is located in-between ends of dovetail 186. In at least some examples the aperture 185 additionally serves as a cable pass-through where the cable carries power to device components.

With reference again to FIG. 4, the lens and imaging unit 210 includes a clamp 432. The clamp 432 is used to hold the lens and imaging unit 210 in place after focusing using a fixed focus lens. Also shown is an IR emitter PCBA 433 which holds the IR emitter 214. Signal cable 435 couples the IR emitter PCBA 433 to the digital PCBA 222.

Continuing on, also shown in FIG. 4 is a gasket 422. The gasket 422 is positioned to abut the inner side of the spherical assembly 110 and thereby provide an opaque barrier to separate the IR emitter 214 from the lens and imaging unit 210.

Figure 6:
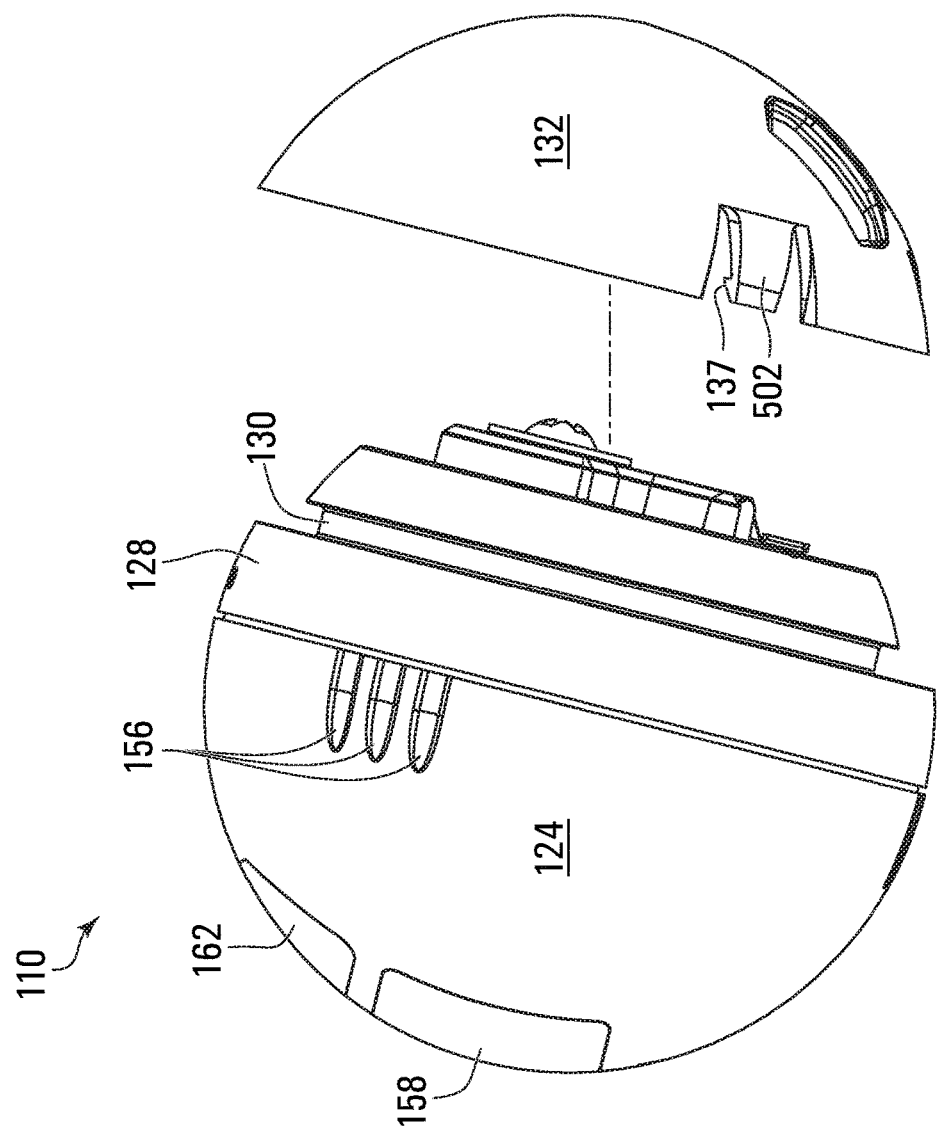
FIG. 6 illustrates a side elevational view of the spherical assembly shown in FIG. 2, a housing part of the spherical assembly being shown as partly disassembled to reveal details of a heat sink.

FIG. 6 illustrates a side elevational view of the spherical assembly 110 with the second housing part 132 being shown as disassembled from the rest of the spherical assembly 110 to reveal details of the heat sink 128. The groove 130 is clearly visible. Also, the snap 137 is shown on arm 502. Any suitable number of arms similar to the arm 502 may be provided on the second housing part 132. As an alternative to the illustrated arm 502, a snap similar to the illustrated snap 137 may be incorporated into and integral with the inner surface of the second housing part 132.

Certain adaptations and modifications of the described embodiments can be made. For example, although certain embodiments of the invention are designed to be included in a camera (for example, a dome camera), other alternative embodiments of the invention are suitable for other types of electronic devices where an exposed heat sink is appropriate. These other types of electronic devices may include, for example, drones, mobile electronic devices, smart kitchen devices, etc. The needed design modifications as between the camera embodiments and these alternative embodiments can be made by one skilled in the art without undue difficulty or inventive effort. Therefore, the above discussed embodiments are considered to be illustrative and not restrictive, and the invention should be construed as limited only by the appended claims.

The invention claimed is:

1. A dome camera comprising:
   a first semi-spherical housing part including a first surface ending at a first peripheral edge;
   a second semi-spherical housing part including a snap and a second surface ending at a second peripheral edge, the second semi-spherical housing part being complementary to the first semi-spherical housing part;

a heat sink defining a groove and having an air exposed surface that is ring-shaped and interposed between the first and second peripheral edges, and surface edges of the air exposed surface that abut the first and second peripheral edges of the housing parts are respectively matched therewith in shape and dimension so that an overall composite surface formed by the first and second surfaces of the housing parts and the air exposed surface of the heat sink is substantially continuous and uniform; and at least one heat-generating device component located within the dome camera and connected to the heat sink, wherein when the dome camera is on and the device component is generating heat, the heat is drawn away from the device component via the heat sink, and wherein the snap is complementary-shaped in relation to the groove that is sized and shaped to align with the snap.

2. The dome camera as claimed in claim 1 wherein the first semi-spherical housing part defines a first housing space, the heat sink defines a second housing space that extends between the surface edges, and the second semi-spherical housing part defines a third housing space, and an overall housing space for the dome camera is constituted by the first housing space, the second housing space and the third housing space.

3. The dome camera as claimed in claim 2 wherein the at least one heat-generating device component includes a sensor printed circuit board assembly and a digital printed circuit board assembly located within the second housing space.

4. The dome camera as claimed in claim 1 wherein the air exposed surface of the heat sink is a finished surface that is electrocoated or powder coated.

5. The dome camera as claimed in claim 1 wherein the first and second semi-spherical housing parts are both made of a combination of polycarbonate and acrylonitrile-butadiene-styrene.

6. A power consuming electronics device comprising:
first and second complementary housing parts, the first housing part including a first surface ending at a first peripheral edge, and the second housing part including a snap and a second surface ending at a second peripheral edge;
a heat sink defining a groove and having an air exposed surface that is closed curved and interposed between the first and second peripheral edges, and surface edges of the air exposed surface that abut the first and second peripheral edges of the housing parts are respectively matched therewith in shape and dimension so that an overall composite surface formed by the first and second surfaces of the housing parts and the air exposed surface of the heat sink is substantially continuous and uniform; and
at least one heat-generating device component located within the electronics device and connected to the heat sink,
wherein the electronics device is a dome camera, and the first and second housing parts when assembled with the heat sink form a spherical shaped housing of the dome camera,
wherein when the electronics device is on and the device component is generating heat, the heat is drawn away from the device component via the heat sink, and
wherein the snap is complementary-shaped in relation to the groove that is sized and shaped to align with the snap.

7. The power consuming electronics device as claimed in claim 6 wherein the at least one heat-generating device component includes a sensor printed circuit board assembly and a digital printed circuit board assembly contained within the spherical shaped housing.

8. The power consuming electronics device as claimed in claim 7 further comprising a thermal interface material within the spherical shaped housing and positioned between the digital printed circuit board assembly and the heat sink.

9. The power consuming electronics device as claimed in claim 7 wherein the sensor printed circuit board assembly has exposed copper that is in direct contact with the heat sink.

10. The power consuming electronics device as claimed in claim 6 wherein the air exposed surface of the heat sink is a finished surface that is electrocoated or powder coated.

11. The power consuming electronics device as claimed in claim 6 wherein each of the first and second peripheral edges are at least partly conic section-shaped.

12. A device comprising:
first and second complementary housing parts, the first housing part including a first surface ending at a first peripheral edge, and the second housing part including a snap and a second surface ending at a second peripheral edge;
a heat sink defining a groove and having an air exposed surface that is interposed between the first and second peripheral edges, and surface edges of the air exposed surface are respectively matched with the first and second peripheral edges of the housing parts for flush abutment to provide combination-discreetness of the an overall composite surface formed by the first and second surfaces of the housing parts and the air exposed surface of the heat sink; and
at least one heat-generating device component located within the device and connected to the heat sink,
wherein the device is a dome camera, and the first and second housing parts when assembled with the heat sink form a spherical shaped housing of the dome camera,
wherein when the device component is generating heat, the heat is drawn away from the device component via the heat sink, and
wherein the snap is complementary-shaped in relation to the groove that is sized and shaped to align with the snap.

13. The device as claimed in claim 12 wherein the at least one heat-generating device component includes a sensor printed circuit board assembly and a digital printed circuit board assembly contained within the spherical shaped housing.

14. The device as claimed in claim 13 further comprising a thermal interface material within the spherical shaped housing and positioned between the digital printed circuit board assembly and the heat sink.

15. The device as claimed in claim 13 wherein the sensor printed circuit board assembly has exposed copper that is in direct contact with the heat sink.

16. The device as claimed in claim 12 wherein the air exposed surface of the heat sink is a finished surface that is electrocoated or powder coated.

17. The device as claimed in claim 12 wherein each of the first and second peripheral edges are at least partly conic section-shaped.

18. The device as claimed in claim 12 wherein the first and second complementary housing parts are both made of a combination of polycarbonate (PC) and acrylonitrile-butadiene-styrene.

* * * * *

UNITED STATES PATENT AND TRADEMARK OFFICE
CERTIFICATE OF CORRECTION

PATENT NO. : 10,795,242 B2
APPLICATION NO. : 15/996137
DATED : October 6, 2020
INVENTOR(S) : Chan et al.

Page 1 of 1

It is certified that error appears in the above-identified patent and that said Letters Patent is hereby corrected as shown below:

In the Claims

Column 8, Lines 33-34, "the an overall composite surface" should read --an overall composite surface--.

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*